(12) United States Patent
Hidaka et al.

(10) Patent No.: US 11,817,339 B2
(45) Date of Patent: Nov. 14, 2023

(54) ELECTROSTATIC CHUCK DEVICE AND METHOD FOR MANUFACTURING SAME

(71) Applicant: SUMITOMO OSAKA CEMENT CO., LTD., Tokyo (JP)

(72) Inventors: Nobuhiro Hidaka, Tokyo (JP); Naoto Kimura, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 644 days.

(21) Appl. No.: 17/041,935

(22) PCT Filed: Mar. 26, 2019

(86) PCT No.: PCT/JP2019/012799
§ 371 (c)(1),
(2) Date: Sep. 25, 2020

(87) PCT Pub. No.: WO2019/189141
PCT Pub. Date: Oct. 3, 2019

(65) Prior Publication Data
US 2021/0013082 A1    Jan. 14, 2021

(30) Foreign Application Priority Data
Mar. 30, 2018   (JP) ................. 2018-066941

(51) Int. Cl.
*H01T 23/00* (2006.01)
*H01L 21/683* (2006.01)
(Continued)

(52) U.S. Cl.
CPC ........ *H01L 21/6833* (2013.01); *C04B 35/117* (2013.01); *C04B 35/64* (2013.01); *H01J 37/32715* (2013.01); *C04B 2235/3217* (2013.01); *C04B 2235/3834* (2013.01); *C04B 2235/3839* (2013.01);
(Continued)

(58) Field of Classification Search
None
See application file for complete search history.

(56) References Cited

U.S. PATENT DOCUMENTS 10,766,057 B2 * 9/2020 Tokashiki ................ B08B 9/00
2014/0205824 A1 * 7/2014 Sun ....................... B32B 27/281
428/458

(Continued)

FOREIGN PATENT DOCUMENTS

WO   2015/137270 A1   9/2015

OTHER PUBLICATIONS

International Search Report for PCT/JP2019/012799 (dated Jun. 25, 2019).

*Primary Examiner* — Stephen W Jackson
(74) *Attorney, Agent, or Firm* — Merchant & Gould P.C.

(57) ABSTRACT

This electrostatic chuck device (1) includes a base (11) having one main surface serving as a mounting surface (19) on which a plate-shaped sample is mounted, and an electrode for electrostatic attraction (13) provided on the side opposite to the mounting surface (19) in the base (11), in which the base (11) consists of a ceramic material as a forming material, and the ceramic material contains aluminum oxide and silicon carbide as main components thereof, and has a layered graphene present at a grain boundary of the aluminum oxide.

10 Claims, 6 Drawing Sheets

(51) Int. Cl.
*C04B 35/117* (2006.01)
*C04B 35/64* (2006.01)
*H01J 37/32* (2006.01)

(52) U.S. Cl.
CPC ............... *C04B 2235/422* (2013.01); *C04B 2235/6562* (2013.01); *C04B 2235/785* (2013.01); *C04B 2235/786* (2013.01); *C04B 2235/85* (2013.01); *H01J 2237/334* (2013.01)

(56) References Cited

U.S. PATENT DOCUMENTS

| | | | |
|---|---|---|---|
| 2016/0020128 A1* | 1/2016 | Wang | H01L 21/6833 361/234 |
| 2017/0057875 A1 | 3/2017 | Ishizuka et al. | |
| 2021/0032521 A1* | 2/2021 | Hakeem | C04B 35/62204 |

* cited by examiner

ELECTROSTATIC CHUCK DEVICE AND METHOD FOR MANUFACTURING SAME

TECHNICAL FIELD

The present invention relates to an electrostatic chuck device and a method for manufacturing the electrostatic chuck device. This application is a U.S. National Stage Application under 35 U.S.C. § 371 of International Patent Application No. PCT/JP2019/012799, filed on Mar. 26, 2019, which claims priority to Japanese Patent Application No. 2018-066941 filed in Japan on Mar. 30, 2018, the disclosures of all of which are hereby incorporated by reference in their entireties.

BACKGROUND

In recent years, in a semiconductor manufacturing apparatus that performs a plasma process, an electrostatic chuck device capable of easily fixing a plate-shaped sample (wafer) has been used. The electrostatic chuck device includes a base and an electrode for electrostatic attraction. The base has one main surface serving as a mounting surface on which the wafer can be mounted. The electrode for electrostatic attraction generates an electrostatic force (Coulomb's force) between itself and the wafer mounted on the mounting surface. (Refer to, for example, Patent Literature No. 1).

CITATION LIST

Patent Literature

[Patent Literature No. 1] International Publication No. WO2015/137270

SUMMARY OF INVENTION

Technical Problem

In recent years, in a semiconductor manufacturing process, further improvement in microfabrication technique has been required with higher integration or higher performance of elements. Accordingly, the electrostatic chuck device is required to have the following performance.

First, the electrostatic chuck device is required to exhibit a sufficient electrostatic attraction force.

For example, in a semiconductor device manufacturing process, it is required to etch a multilayer film according to the lamination of a semiconductor device. In a case of etching a multilayer film, there is a case where it is required to form a hole having a uniform etching direction or opening diameter in a short time and deeply. An etching apparatus which is used for etching a multilayer film performs processing by inputting high-power (high-voltage and high-current) electric power as compared with etching apparatuses of the related art.

In such a case, if the electrostatic chuck device does not efficiently transmit a high frequency, that is, if it absorbs a large amount of high frequencies, the electrostatic chuck device itself generates heat, which causes a temperature rise of a processing object such as a wafer. If the temperature of the processing object rises in this manner, a problem may occur in which processing conditions do not become constant, so that processing accuracy cannot be maintained. Further, a wafer having a multilayer film formed thereon tends to have a large deformation amount due to thermal stress. Therefore, the electrostatic chuck device is required to fix the wafer with a high attraction force in a case of etching a multilayer film, as compared with a case of processing a wafer in the related art.

In the electrostatic chuck device, a high electrostatic attraction force is obtained by increasing an applied voltage which is applied to the electrode for electrostatic attraction. On the other hand, if the applied voltage is increased in the electrostatic chuck device, there is a case where a semiconductor element on the wafer which is a processing object is damaged. Therefore, in the electrostatic chuck device, it has been required to increase the attraction force without increasing the applied voltage.

Further, the electrostatic chuck device which is used in the etching apparatus also has a function as a high-frequency electrode for generating plasma which is used in etching processing, in addition to the function of fixing the wafer.

Therefore, the base of the electrostatic chuck device is required to have good high-frequency transmission performance and to function as a high-frequency transmission window.

The electrostatic attraction force of the electrostatic chuck device depends on the relative dielectric constant of a dielectric configuring the base. That is, in the base, the higher the relative dielectric constant is, the higher the electrostatic attraction force becomes, which is preferable.

The present invention has been made in view of the above circumstances and has an object to provide an electrostatic chuck device that has a high attraction force and can suitably transmit a high frequency, and a method for manufacturing the electrostatic chuck device.

Solution to Problem

In order to solve the above problems, according to a first aspect of the present invention, there is provided an electrostatic chuck device including: a base having one main surface serving as a mounting surface on which a plate-shaped sample is mounted; and an electrode for electrostatic attraction provided on a side opposite to the mounting surface in the base, in which the base consists of a ceramic material as a forming material, and the ceramic material is a sintered body containing aluminum oxide and silicon carbide as main components thereof and having a layered graphene present at a grain boundary of the aluminum oxide.

In an aspect of the present invention, s configuration may be adopted in which the sintered body further contains β-SiC type silicon carbide.

In an aspect of the present invention, a configuration may be adopted in which a relative dielectric constant of the ceramic material at a frequency of 10 Hz is 12.3 or more at a frequency of 10 Hz, and a relative dielectric constant of the ceramic material at a frequency of 1 MHz is 12.5 or less.

In an aspect of the present invention, the sintered body may contain 4% by volume or more and 15% by volume or less of the β-SiC type silicon carbide based on that of the sintered body.

In an aspect of the present invention, the electrode for electrostatic attraction may consists of conductive ceramics as a forming material.

In an aspect of the present invention, the base may be made of only the ceramic material, and the silicon carbide may be made of only β-SiC type silicon carbide.

In an aspect of the present invention, in the ceramic material, an average crystal grain size of crystal grains of the aluminum oxide may be 2 μm or less, an average crystal grain size of crystal grains of the silicon carbide may be 0.2

µm or less, and a thickness of the layered graphene may be 5 nm or more and 1000 nm or less.

According to a second aspect of the present invention, there is provided a method for manufacturing the electrostatic chuck device according to the first aspect of the present invention, the method including: a step of heat-treating a formed body obtained by forming granules composed of mixed particles of aluminum oxide particles and silicon carbide particles at a temperature of 500° C. or lower with a rate of temperature rise of 0.3° C./min or more; and a step of sintering the formed body, which has been treated in the step of heat treating, to form a sintered body containing aluminum oxide and silicon carbide as main components thereof and having a layered graphene present at a grain boundary of the aluminum oxide.

In an aspect of the present invention, the step of sintering the formed body may include a sub-step of heating the formed body at a temperature of 1600° C. or lower in a vacuum atmosphere, before sintering in an inert gas atmosphere.

In an aspect of the present invention, the step of heat-treating may be performed at normal pressure in an inert gas atmosphere.

Advantageous Effects of Invention

According to the present invention, it is possible to provide an electrostatic chuck device having a high attraction force and high high-frequency transparency and a method for manufacturing the electrostatic chuck device.

DESCRIPTION OF EMBODIMENTS

Figure 1:
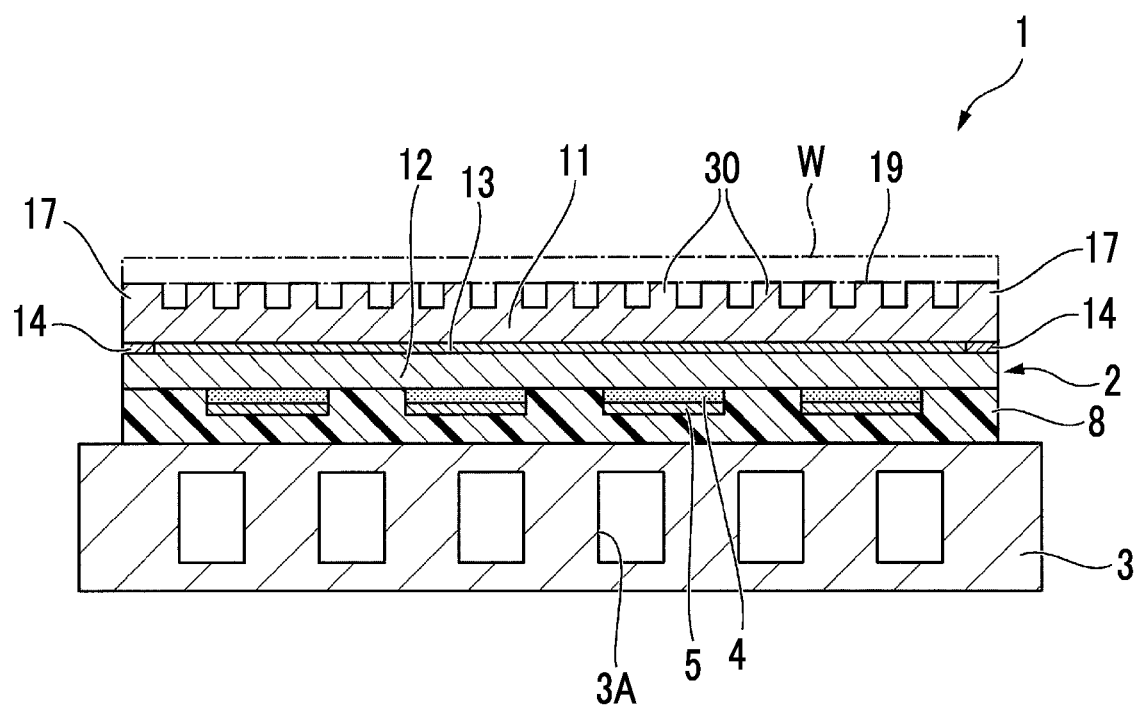
FIG. 1 is a schematic sectional view of an example of an electrostatic chuck device according to the present embodiment.

Preferred examples of embodiments of an electrostatic chuck device and a method for manufacturing the electrostatic chuck device according to the present invention will be described. In all the following drawings, in order to make the drawings easy to see, a dimension, a ratio, or the like of each constituent element is appropriately varied.

The present embodiment is to be specifically described for better understanding of the gist of the invention, and does not limit the invention unless otherwise specified. That is, the present invention is not limited to embodiments described below, and can be implemented with appropriate modifications within a scope in which the effect of the present invention is exhibited. For example, the number, a numerical value, an amount, a ratio, a shape, a position, a characteristic, or the like can be omitted, added, or changed within a scope which does not depart from the gist of the present invention.

<Electrostatic Chuck Device>

Hereinafter, a preferred example of an electrostatic chuck device 1 according to the present embodiment will be described with reference to FIG. 1.

In the drawing described below, in order to make the drawing easy to see, a dimension, a ratio, or the like of each constituent element is appropriately varied.

FIG. 1 is a schematic sectional view of an example of the electrostatic chuck device 1. The electrostatic chuck device 1 shown in FIG. 1 includes an electrostatic chuck part 2, a temperature adjusting base part 3, and a resin layer 8. The upper surface of the electrostatic chuck part 2 is a mounting surface 19 on which a plate-shaped sample W such as a semiconductor wafer is mounted. The temperature adjusting base part 3 adjusts the temperature of the electrostatic chuck part 2 to a desired temperature. The resin layer 8 bonds and integrates the electrostatic chuck part 2 and the temperature adjusting base part 3 together. In the following description, there is a case where the relative position between the respective configurations is represented with the mounting surface 19 side as an "upper side" and the temperature adjusting base part 3 side as a "lower side".

[Electrostatic Chuck Part]

The electrostatic chuck part 2 includes a placing plate (base) 11, a supporting plate 12, an electrode for electrostatic attraction 13, and an insulating material layer 14. The upper surface of the placing plate (base) 11 serves as the mounting surface 19 on which the plate-shaped sample W such as a semiconductor wafer is mounted. The supporting plate 12 is provided on the side opposite to the mounting surface 19 of the placing plate 11. The insulating material layer 14 is sandwiched between the placing plate 11 and the supporting plate 12 and surrounds the electrode for electrostatic attraction 13.

[Placing Plate (Base)]

A plurality of projection portions 30 each having a diameter smaller than the thickness of the plate-shaped sample W are formed on the mounting surface 19 of the placing plate 11. The electrostatic chuck device 1 has a configuration in which the plurality of projection portions 30 support the plate-shaped sample W.

Further, a peripheral edge wall 17 is formed at the peripheral edge of the mounting surface 19. The peripheral edge wall 17 is formed at the same height as the projection portions 30, and supports the plate-shaped sample W together with the projection portions 30.

The material for forming the placing plate 11 is, for example, a ceramic material. The material for forming the placing plate 11 is preferably a ceramic material having a relative dielectric constant of 12.3 or more at a frequency of 10 Hz and a relative dielectric constant of 12.5 or less at a frequency of 1 MHz. The relative dielectric constant of the forming material at a frequency of 10 Hz is, for example, 12.3 or more, preferably 12.4 or more, more preferably 12.5 or more, and further preferably 13.0 or more. The relative dielectric constant at a frequency of 1 MHz is, for example, 12.5 or less, and more preferably 12.3 or less.

The material for forming the placing plate 11 is, for example, a ceramic material. The material for forming the placing plate 11 is preferably a ceramic material having a relative dielectric constant of 12.25 or more at a frequency of 0.2 kHz and a relative dielectric constant of 12.5 or less at a frequency of 1 MHz. The relative dielectric constant of the forming material at a frequency of 0.2 kHz is preferably 12.25 or more, and more preferably 12.3 or more, and may be 12.4 or more or 12.5 or more. The relative dielectric constant at a frequency of 1 MHz is, for example, 12.5 or less, and more preferably 12.3 or less.

Hereinafter, there is a case where the ceramic material that is the material for forming the placing plate 11 is referred to as a "first ceramic material". It is preferable that the placing plate 11 is made of only a ceramic material.

The relative dielectric constant of the forming material at a frequency of 10 Hz is within the range described above, whereby the placing plate 11 can satisfactorily hold the wafer on the mounting surface 19 when a voltage is applied to the electrode for electrostatic attraction 13. Further, even if the relative dielectric constant of the forming material at a frequency of 0.2 kHz is within the range described above, the placing plate 11 can satisfactorily hold the wafer on the mounting surface 19 when a voltage is applied to the electrode for electrostatic attraction 13.

Further, the relative dielectric constant at a frequency of 1 MHz is within the range described above, whereby the placing plate 11 can satisfactorily hold the wafer on the mounting surface 19 when a voltage is applied to the electrode for electrostatic attraction 13.

Here, the "frequency of 10 Hz" is a frequency close to a direct current that affects the electrostatic attraction force. A voltage having a frequency of 10 Hz or less includes a direct-current voltage.

Further, the "frequency of 1 MHz" is a frequency which includes a frequency band which generates plasma in an etching apparatus.

It is preferable that the material for forming the placing plate 11 has a volume resistivity value of $5 \times 10^{13}$ Ω·cm or more in a temperature range of −80° C. or higher and 130° C. or lower, and even in a temperature range of −80° C. or higher and 150° C. or lower, the volume resistivity value is more preferably $5 \times 10^{13}$ Ω·cm or more, and further preferably $1 \times 10^{14}$ Ω·cm or more. The upper limit value can be optionally selected. However, $1 \times 10^{16}$ Ω·cm or less or the like can be given as an example. Further, it is preferable that the material for forming the placing plate 11 has a volume resistivity value of $1 \times 10^{14}$ Ω·cm or more in a temperature range of −80° C. or higher and 130° C. or lower, and even in a temperature range of −80° C. or higher and 150° C. or lower, the volume resistivity value is more preferably $1 \times 10^{14}$ Ω·cm or more.

The first ceramic material as described above is used as the material for forming the placing plate 11, whereby it is possible to provide an electrostatic chuck device that can deal with a wide temperature range from a low temperature range to a high temperature range and has a high attraction force and good high-frequency transparency.

As the first ceramic material as described above, a composite material is preferable in which an insulating material is used as a matrix and a conductive material is dispersed in the matrix. The conductive material is a material having electrical conductivity. Each value of the relative dielectric constant, the dielectric loss, and the volume resistivity value of such a composite material can be considered as follows.

The relative dielectric constant of the composite material depends on an internal polarization structure. Polarization is roughly classified into electronic polarization, ionic polarization, orientation polarization, and interfacial polarization. The relative dielectric constant of the composite material is the sum of the relative dielectric constants resulting from the respective polarizations. In a case where the material is considered to be used as the material for forming the electrostatic chuck device, a use environment in which it is exposed to a high frequency is assumed. In that case, the relative dielectric constant of the composite material is greatly affected by the electronic polarization and the interfacial polarization.

The electronic polarization does not involve the transfer of an electric charge within a dielectric. Therefore, the polarization is maintained even in a high frequency range.

In contrast, the interfacial polarization involves the transfer of an electric charge in a dielectric. The transfer of an electric charge cannot follow a change (reversal) of a pole if a frequency becomes higher. Therefore, the relative dielectric constant due to the interfacial polarization does not increase according to an increase in frequency in the high frequency region. On the other hand, the relative dielectric constant due to the interfacial polarization increases according to an increase in frequency in the low frequency region. Here, although not limited to this example, the high frequency region refers to, for example, a region of 1 MHz or higher, or a region of 20 MHz or higher, and the low frequency region refers to, for example, a region of 200 Hz or lower, or a region of 20 Hz or lower.

The interfacial polarization occurs at the interface between materials having different electrical resistances. Therefore, the interfacial polarization can be generated by dispersing a material such as a conductive material, having a lower resistance value than the insulating material, in the insulating material that is the matrix of the composite material described above, or the like.

The interfacial polarization depends on the area of an interface. If the area of an interface increases in the composite material, the number of places where the interfacial polarization occurs increases. That is, if the area of an interface increases in the composite material, the relative dielectric constant due to the interfacial polarization increases. For example, if the particle diameter of the conductive material is small, the area of the interface increases, and thus the relative dielectric constant of the composite material increases.

Further, if the amount of the conductive material which is included in the composite material is large, the relative dielectric constant of the composite material increases. However, if the amount of the conductive material is too large, the conductive materials come into contact with each other, and thus a conductive path through the conductive material is formed. Therefore, it is preferable that the amount of the conductive material which is included in the composite material is in a range where the conductive materials do not come into contact with each other. Here, the conductive path refers to a pathway having electrical conductivity.

The dielectric loss of the composite material increases if the amount of metal impurities which are included in the insulating material that is the matrix increases. Further, if the amount of the conductive material which is included in the composite material is large, the dielectric loss of the composite material increases.

The volume resistivity value of the composite material is lowered if the amount of the conductive material which is included in the composite material is large.

Further, the volume resistivity value of the composite material described above is lowered if the amount of metal impurities in the insulating material that is the matrix is large.

Further, if a material having a high covalent bonding property, a small number of lattice defects, and a small amount of impurities is used as the insulating material that is the matrix, the volume resistivity value of the composite material in the high temperature region is lowered.

As the conductive material, a material is preferable which does not easily react with the impurity element included in the conductive material, or the insulating material, and is difficult to form a phase having a lower volume resistivity value than the insulating material even though it reacts with the impurity element or the insulating material. Further, as the conductive material, a material is preferable which does not generate lattice defects in the insulating material that is the matrix when it is diffused in the matrix.

Having high high-frequency transparency may be confirmed by a change in frequency and a difference in dielectric constant. For example, it may be confirmed by the difference between the dielectric constants at the frequencies of 0.2 kHz and 1000 kHz being 0.2 or more and the relative dielectric constant at 0.2 kHz being 12.25 or more. Further, it may be confirmed by the difference between the dielectric constants at 10 Hz and 1000 kHz being 0.25 or more and the relative dielectric constant at 10 Hz being 12.3 or more.

(Composition)

The first ceramic material having the physical properties as described above is a sintered body containing aluminum oxide and silicon carbide as main components thereof and having a layered graphene present at a grain boundary of aluminum oxide. The material is preferably a sintered body which includes aluminum oxide, a layered graphene, and β-SiC type silicon carbide as silicon carbide. Hereinafter, the β-SiC type silicon carbide is simply referred to as "β-SiC". The main component may mean that the raw material forming the first ceramic material includes the largest amount of aluminum oxide and the second largest amount of silicon carbide. Alternatively, the material most abundant in the formed first ceramic material may be aluminum oxide, and the second most abundant material may be silicon carbide. In the latter case, the third most abundant material may be graphene. The total proportion of aluminum oxide and silicon carbide in the first ceramic material may be in a range of 90 to 99.999% by volume or in a range of 97 to 99.99% by volume.

Further, the first ceramic material may be a sintered body containing aluminum oxide and graphene as main components thereof.

The graphene may be formed by thermal decomposition or the like of silicon carbide. In the first ceramic material, the amount of the formed graphene may be smaller or larger than the amount of silicon carbide which is included in the material, as long as a preferable effect can be obtained. The proportion of the graphene which is formed from silicon carbide is optionally selected. However, for example, the amount of the graphene is preferably in a range of 0.1 to 20% by volume with respect to the total amount of silicon carbide which is included in the first ceramic material, and may be in a range of 0.5 to 10% by volume.

The ratio of aluminum oxide to silicon carbide can be optionally selected. However, for example, aluminum oxide:silicon carbide is preferably in a range of 96:4 to 85:15 as a volume ratio, and more preferably in a range of 94:6 to 90:10.

In the first ceramic material, it is preferable that the crystal grains of silicon carbide, preferably β-SiC, are dispersed in a state of being surrounded by aluminum oxide which is the matrix material.

In the first ceramic material, the layered graphene is present at the grain boundary of aluminum oxide. The layered graphene being present at the grain boundary of aluminum oxide means that the crystal grains of aluminum oxide are gathered at least partially through the layered graphene.

The number of layered graphene layers is not particularly limited. However, it may be, for example, 1 or more, 3 or more, or 5 or more. The upper limit number can be optionally selected. However, it may be, for example, 3000 or less, 200 or less, or 20 or less.

In a case where the placing plate 11 is formed by using such a first ceramic material, if a direct-current voltage for electrostatic attraction is applied to the electrode for electrostatic attraction 13 (described later), interfacial polarization occurs at the interface between the crystal grain of aluminum oxide, which is an insulating material, the crystal grain of silicon carbide, which is a conductive material, preferably β-SiC, and the layered graphene. The interface as referred to herein may include any of the interface between the crystal grain of aluminum oxide and β-SiC, the interface between the crystal grain of aluminum oxide and the layered graphene, and the interface between β-SiC and the layered graphene. As a result, the relative dielectric constant increases as compared with a ceramic material composed of only aluminum oxide.

On the other hand, in the placing plate 11 formed by using the first ceramic material, the interfacial polarization at the crystal grains described above is difficult to follow the high frequency which is applied to generate plasma and control a plasma state in an etching apparatus. Therefore, in the placing plate 11 formed by using the first ceramic material, as compared with a placing plate formed by only aluminum oxide, the relative dielectric constant does not increase with respect to a high frequency and the high-frequency transparency is not easily lowered.

In the first ceramic material, the volume ratio of silicon carbide, preferably β-SiC, in the entire first ceramic material (hereinafter, there is a case of being simply referred to as an "entire sintered body") is preferably, for example, 4% by volume or more, and more preferably 6% by volume or more. Further, the volume ratio of silicon carbide, preferably β-SiC, in the entire sintered body is preferably, for example, 15% by volume or less, and more preferably 10% by volume or less. With respect to the volume ratio of β-SiC, the upper limit value and the lower limit value can be optionally combined.

In the first ceramic material, the relative dielectric constant of the sintered body can be increased by setting the volume ratio of silicon carbide, preferably β-SiC, to 4% by volume or more of the entire sintered body. Further, in the first ceramic material, the volume ratio of silicon carbide, preferably β-SiC, is set to 15% by volume or less of the entire sintered body, thereby suppressing the contact between SiC particles, and thus the transfer of an electric charge through the SiC particles can be made difficult to occur. In this way, it is possible to suppress a decrease in the resistance value of the sintered body.

In the first ceramic material, the volume ratio of aluminum oxide in the entire first ceramic material is preferably, for example, 85% by volume or more, more preferably 87% by volume or more, and further preferably 90% by volume or more. The volume ratio is preferably 96% by volume or less, and more preferably 94% by volume or less.

(Crystal Grain Size)

Further, in the first ceramic material, the average crystal grain size of the crystal grains of aluminum oxide can be optionally selected. However, it is preferably 2 μm or less, and may be 1.5 μm or less. The average crystal grain size of the crystal grains of silicon carbide, preferably β-SiC, can be optionally selected. However, it is preferably 0.2 µm or less, and may be 0.1 µm or less. The lower limit value of the grain size can be optionally selected. However, for example, it may be, for example, 0.01 µm or more. The value of the average crystal grain size can be obtained by measuring the surface mirror-polished and etched, for example, by an SEM observation method by using a scanning electron microscope (SEM). The lower limit can be obtained, for example, by measurement with a transmission electron microscope.

If the average crystal grain sizes of aluminum oxide and silicon carbide, preferably β-SiC, configuring the first ceramics material are the values as described above, the contact area between aluminum oxide and silicon carbide such as β-SiC increases. The interfacial polarization occurs at the interface between aluminum oxide and silicon carbide such as β-SiC. Therefore, in the addition of the same amount of SiC, the contact area between aluminum oxide and β-SiC is increased by making silicon carbide such as β-SiC finer and increasing the specific surface area of β-SiC, and thus it is possible to enhance the effect of the interfacial polarization.

Further, if the average crystal grain sizes of aluminum oxide and silicon carbide such as β-SiC configuring the first ceramics material are the values as described above, in a case where the placing plate 11 is exposed to plasma, the surface of the placing plate 11 becomes difficult to be roughened due to the following reasons. That is, roughening does not occur, which is preferable.

First, since aluminum oxide is a hexagonal system, due to the crystal orientation, a difference occurs in an etching rate by plasma. Therefore, in a case where the placing plate 11 is exposed to plasma, irregularities due to the difference in etching rate easily occur in the aluminum oxide portion of the surface of the placing plate. However, by reducing the crystal grain size of aluminum oxide to 2 µm or less, it is possible to reduce the irregularities due to the difference in etching rate caused by the crystal orientation.

Further, silicon carbide such as β-SiC is inferior in corrosion resistance to fluorocarbon plasma, as compared with aluminum oxide. However, since β-SiC is a tetragonal system, there is no difference in etching rate due to the crystal orientation. Therefore, in a case where the placing plate 11 is exposed to plasma, irregularities due to the difference in etching rate does not easily occur in the β-SiC portion of the surface of the placing plate.

In addition, the average crystal grain size of silicon carbide such as β-SiC of the first ceramic material is sufficiently smaller than the average crystal grain size of aluminum oxide. Therefore, even if all the β-SiC portions on the surface of the placing plate are etched, recesses which are formed are sufficiently small with respect to the crystal grain of aluminum oxide, and thus it is difficult for a height difference to occur.

As described above, irregularities are not easily generated on the surface of the placing plate using the first ceramic material as a forming material.

In the first ceramic material, the layered graphene is a monatomic thin film that configures graphite. The graphite is a stack of graphene in which carbon atoms have a honeycomb structure (structure in which regular hexagons are arranged without gaps) on a plane. In the present embodiment, the layered graphene has preferably 20 layers or less. The reason why 20 layers or less is preferable is that the excellent electrical conductivity specific to the graphene decreases as the number of layers increases.

The thickness of the layered graphene can be optionally selected. However, it is preferably 0.1 nm or more and 1000 nm or less, and more preferably 0.3 nm or more and 100 nm or less.

If the thickness of the layered graphene configuring the first ceramic material is the value as described above, the contact area between aluminum oxide and the layered graphene increases. The interfacial polarization also occurs at the interface between aluminum oxide and the layered graphene. Therefore, by reducing the thickness of the layered graphene and increasing the specific surface area of the layered graphene, the contact area between aluminum oxide and the layered graphene is increased. That is, the thickness of the layered graphene is within the range as described above, whereby it is possible to enhance the effect of the interfacial polarization.

The presence or absence of the layered graphene or the thickness thereof may be confirmed, for example, by fabricating a thin piece of a base, and taking 20 scanning transmission electron microscope images at an observation magnification in a range of 50,000 to 500,000 times while changing a position.

(Other)

If β-SiC is included in the first ceramic material, in a case where the surface of the placing plate 11 is exposed to plasma, damage to the surface of the placing plate due to abnormal discharge can be reduced due to the following mechanism.

In a case where the placing plate 11 is exposed to plasma, electrons or ions in the plasma collide with the surface of the placing plate 11, and secondary electrons are emitted from the surface. In this way, the surface of the placing plate 11 is positively charged. Further, electrons in the plasma further collide with the charged surface of the placing plate 11, whereby the surface is further charged. Further, if the surface of the placing plate 11 is positively charged, electrons are attracted to the surface of the placing plate 11. Therefore, if the surface of the placing plate 11 is positively charged, the accelerated electrons collide with the placing plate 11. As a result, a lightning discharge occurs on the surface of the placing plate 11, causing damage to the surface of the placing plate 11 and dielectric breakdown of the placing plate 11.

On the other hand, in the first ceramic material configuring the placing plate 11, in a case where the crystal grains of β-SiC are dispersed in the matrix that is aluminum oxide, electrons are supplied from β-SiC, whereby the charging of the surface of the placing plate 11 is suppressed. As a result, damage to the placing plate (discharge breakdown due to lightning discharge) can be suppressed.

Further, since the β-SiC particles are smaller than the aluminum oxide particles, it is difficult for an electric field to concentrate on the β-SiC particles. That is, it is possible to reduce a discharge due to the concentration of the electric field on β-SiC. Similarly, the thickness of the layered graphene is small compared to the aluminum oxide particles, whereby it is difficult for an electric field to be concentrated on the layered graphene. That is, it is possible to reduce a discharge due to the concentration of the electric field on the layered graphene.

[Supporting Plate]

The supporting plate 12 supports the electrode for electrostatic attraction 13 from below. The supporting plate 12 uses an insulating ceramic material as a forming material. Specifically, the supporting plate 12 uses, as a forming material, a ceramic material having a relative dielectric constant of 12.5 or less at a frequency of 1 MHz. Therefore, the supporting plate 12 has a function as a good high-frequency transmission window.

Further, it is preferable that the supporting plate 12 has a coefficient of thermal expansion close to that of the electrode for electrostatic attraction 13 (described later). The coefficient of thermal expansion of the supporting plate 12 is close to that of the electrode for electrostatic attraction, whereby it is possible to suppress the interfacial peeling between the supporting plate 12 and the electrode for electrostatic attraction 13 during use.

It is preferable that the supporting plate 12 is made of an insulating ceramic sintered body having mechanical strength and durability against a corrosive gas and plasma. Although the material for forming the supporting plate 12 is not limited to the following, the material is, for example, aluminum oxide-silicon carbide ($Al_2O_3$—SiC) composite sintered body, aluminum oxide ($Al_2O_3$) sintered body, aluminum nitride (AlN) sintered body, or yttrium oxide ($Y_2O_3$) sintered body.

Further, the supporting plate 12 may be made of an insulating resin such as polyimide to have a structure that is inexpensive and is easily processed.

[Electrode for Electrostatic Attraction]

In the electrode for electrostatic attraction 13, a voltage is applied thereto, whereby an electrostatic attraction force for holding the plate-shaped sample W on the mounting surface 19 is generated.

Although the electrode for electrostatic attraction 13 is not particularly limited as long as it is a conductive material having excellent heat resistance, it is preferable that the coefficient of thermal expansion of the electrode for electrostatic attraction 13 is close to that of the supporting plate 12.

Above all, the electrode for electrostatic attraction 13 is preferably a ceramic material having electrical conductivity. Hereinafter, there is a case where the material for forming the electrode for electrostatic attraction 13 is referred to as a "second ceramic material".

In a case where the material for forming the electrode for electrostatic attraction 13 is a metal material such as molybdenum, tungsten, or niobium, there is a case where these metal atoms diffuse into the placing plate 11 at the time of a use which is heated to a high temperature. Then, these metal atoms diffused into the placing plate 11 reduce the covalent bonding property of aluminum oxide included in the placing plate 11, whereby there is a case of causing a decrease in the volume resistivity value and a decrease in the separation characteristic of the placing plate 11 at a high temperature.

Further, a metal material such as molybdenum, tungsten, or niobium reacts with β-SiC included in the placing plate 11 at a high temperature to generate various types of carbide or silicide. These reaction products cause a decrease in the withstand voltage of the placing plate 11.

On the other hand, in a case where a ceramic material having electrical conductivity is used as the material for forming the electrode for electrostatic attraction 13, it is possible to avoid a defect that is expected in a case where the material for forming the electrode for electrostatic attraction 13 is a metal material, as described above.

The electrode for electrostatic attraction 13 may be joined to the placing plate 11 by sintering or heat. Further, in a case where the material for forming the supporting plate 12 is a ceramic material, the electrode for electrostatic attraction 13 may be joined to the supporting plate 12 by sintering or heat.

Ina case where the electrode for electrostatic attraction 13 is joined to the placing plate 11 by sintering or heat, the second ceramic material is preferably a composite material of an insulating ceramic material and a conductive material.

As the insulating ceramic material, aluminum oxide is preferable because it is easily joined to the placing plate 11 by sintering or heat.

As the conductive ceramic material containing carbon, which can be given as an example of the conductive material, tantalum carbide, molybdenum carbide, titanium carbide, or silicon carbide is preferable because it has excellent heat resistance.

As a carbon material that can be given as an example of the conductive material, acicular carbon or graphite can be exemplified.

The content rate of the conductive material in the second ceramic material is preferably 1% by volume or more and 60% by volume or less, and more preferably 3% by volume or more and 30% by volume or less. If the content rate of the conductive material is 1% by volume or more, it is possible to secure the electrical conductivity necessary for the electrode for electrostatic attraction 13. Further, if the content rate of the conductive material is 60% by volume or less, it is possible to reduce damage due to the difference in coefficient of thermal expansion between the placing plate 11 and the electrode for electrostatic attraction 13. Further, the content rate of the conductive material is set to 3% or more and 30% or less, whereby the effects described above can be obtained more preferably.

It is preferable that the electrode for electrostatic attraction 13 is formed thin in order to satisfactorily transmit a high frequency. Therefore, the thickness of the electrode for electrostatic attraction 13 is preferably 50 μm or less, and more preferably 20 μm or less. The electrode for electrostatic attraction 13 is preferably 2 μm or more, and more preferably 4 μm or more, from the viewpoint of stably holding the wafer.

Further, in order for an electrostatic attraction force to be immediately obtained when a voltage is applied to the electrode for electrostatic attraction 13, the volume resistivity value of the material for forming the electrode for electrostatic attraction 13 is preferably 0.01 Ω·cm or more and 10,000 Ω·cm or less, and more preferably 0.1 Ω·cm or more and 10,000 Ω·cm or less.

[Insulating Material Layer]

The insulating material layer 14 surrounds the electrode for electrostatic attraction 13 to protect the electrode for electrostatic attraction 13 from a corrosive gas and the plasma thereof. In addition, the insulating material layer 14 joins and integrates the boundary portion between the placing plate 11 and the supporting plate 12 except for the electrode for electrostatic attraction 13.

The insulating material layer 14 is made of an insulating material having the same composition or the same main component as that of the material configuring the placing plate 11 and the supporting plate 12.

[Heater Element]

A heater element 5 is provided on the lower surface side of the electrostatic chuck part 2. The heater element 5 is obtained, for example, by processing a non-magnetic metal thin plate having a constant thickness of 0.2 mm or less, preferably about 0.1 mm, such as a titanium (Ti) thin plate, a tungsten (W) thin plate, a molybdenum (Mo) thin plate, or the like, for example, into a desired heater shape, for example, a shape in which a band-like conductive thin plate meanders and the entire contour is an annular shape, by a photolithography method or laser processing.

The heater element 5 may be provided by bonding a non-magnetic metal thin plate to the electrostatic chuck part 2 and then processing and forming the non-magnetic metal thin plate on the surface of the electrostatic chuck part 2, or may be provided by transfer-printing the heater element 5 processed and formed at a position different from the electrostatic chuck part 2 onto the surface of the electrostatic chuck part 2.

An adhesion layer 4 is provided in order to bond the heater element 5 to the lower surface side of the electrostatic chuck part 2 (the bottom surface of the supporting plate 12). The adhesion layer 4 has the same planar shape as the heater element 5.

As the adhesion layer 4, a sheet-shaped or film-shaped adhesive resin having a uniform thickness and having heat resistance and insulation properties can be used. As the material for forming the adhesion layer 4, polyimide resin, silicone resin, epoxy resin, or the like can be adopted.

[Temperature Adjusting Base Part]

The temperature adjusting base part 3 is for adjusting the temperature of the electrostatic chuck part 2 to a desired temperature, and has a thick disk shape. As the temperature adjusting base part 3, for example, a liquid cooling base or the like, in which a flow path 3A for circulating a refrigerant is formed in the interior thereof, is suitable.

As a material configuring the temperature adjusting base part 3, as long as it is a metal having excellent thermal conductivity, electrical conductivity, and workability, or a compound material containing the metal, there is no particular limitation. Although not limited to the following examples, for example, aluminum (Al), an aluminum alloy, copper (Cu), a copper alloy, stainless steel (SUS), or the like is suitably used. It is preferable that at least the surface which is exposed to plasma, of the temperature adjusting base part 3, is subjected to alumite treatment or has a thermally sprayed film of an insulating material such as aluminum oxide formed thereon.

[Resin Layer]

The resin layer 8 is provided between the electrostatic chuck part 2 and the temperature adjusting base part 3. The resin layer 8 bonds and integrates the electrostatic chuck part 2 with the heater element 5 bonded thereto and the temperature adjusting base part 3 together and also has a function of relieving thermal stress which is generated when the electrostatic chuck part 2 is heated during use.

It is preferable that the resin layer 8 has few voids or defects in the interior of the resin layer 8, or the interfaces between the resin layer 8 and the electrostatic chuck part 2, between the resin layer 8 and the heater element 5, and between the resin layer 8 and the temperature adjusting base part 3. If voids or defects are formed at these positions, there is a case where a heat transfer property is reduced, so that the temperature uniformity of the plate-shaped sample W is hindered.

The resin layer 8 is formed of, for example, a cured product obtained by heating and curing a silicone-based resin composition, or an acrylic resin. It is preferable that the resin layer 8 is formed, for example, by disposing a fluid resin composition between the electrostatic chuck part 2 and the temperature adjusting base part 3 and then heating and curing the resin composition. By forming the resin layer 8 by the method described above, the irregularities between the electrostatic chuck part 2 and the temperature adjusting base part 3 are filled with the resin layer 8, and the resin layer 8 does not easily cause voids or defects in the interior of the resin layer 8 or the interfaces between the resin layer 8 and the electrostatic chuck part 2, between the resin layer 8 and the heater element 5, and between the resin layer 8 and the temperature adjusting base part 3. Therefore, the heat conduction characteristic of the resin layer 8 can be made uniform in a plane, and thus the temperature uniformity of the electrostatic chuck part 2 can be improved.

[Other Configurations]

The electrostatic chuck device 1 has a gas supply hole (not shown) and a lift pin insertion hole, which penetrate the electrostatic chuck part 2 in the thickness direction. The gas supply hole and the lift pin insertion hole are open in the mounting surface 19.

A cooling gas such as He is supplied to the gas supply hole. The cooling gas introduced from the gas supply hole flows through the gap between the mounting surface 19 and the lower surface of the plate-shaped sample W or between the plurality of projection portions 30 to cool the plate-shaped sample W.

A lift pin (not shown) that supports the plate-shaped sample W and moves the plate-shaped sample W up and down is inserted into the lift pin insertion hole.

The electrostatic chuck device 1 has the configuration as described above.

<Method for Manufacturing Electrostatic Chuck Device>

Next, a preferred example of the method for manufacturing an electrostatic chuck device according to the present embodiment will be described. In the following description, particularly, a method for manufacturing the placing plate 11 described above will be described in detail.

The method for manufacturing an electrostatic chuck device according to the present embodiment is a method for manufacturing the electrostatic chuck device of the embodiment described above. The method for manufacturing an electrostatic chuck device according to the present embodiment includes: a step of heat-treating a formed body, which is obtained by forming, for example, uniaxially forming, granules composed of mixed particles of aluminum oxide particles and silicon carbide particles, at a temperature of 500° C. or lower with a rate of temperature rise of 0.3° C./min or more (hereinafter referred to as a "step A"); and a step of sintering the formed body after the heat treatment to form a sintered body containing aluminum oxide and silicon carbide as main components thereof and having a layered graphene present at a grain boundary of aluminum oxide (hereinafter referred to as a "step B").

As a starting material for the placing plate 11, for example, aluminum oxide particles and β-SiC particles are used.

The average particle diameter of the aluminum oxide particles is preferably 0.05 µm or more and 0.5 µm or less, and more preferably 0.05 µm or more and 0.2 µm or less.

It is preferable that the aluminum oxide particles which are used have a content of aluminum oxide of 99.99% or more. Such high-purity aluminum oxide particles can be prepared by using the alum method. In the aluminum oxide particles prepared by using the alum method, the content of sodium atoms, which are metal impurities, can be greatly reduced as compared with, for example, aluminum oxide particles prepared by using the Bayer method. Further, various methods can be adopted as long as aluminum oxide particles having a desired purity can be obtained. For example, even aluminum oxide adjusted by using the Bayer method can be used as long as the content of aluminum oxide is 99.99% or more.

It is preferable that the β-SiC particles have an average particle diameter of 0.1 µm or less and the amount of metal impurities of 200 ppm or less. Further, as the β-SiC powder, powder synthesized by thermal plasma CVD is preferable.

The lower limit of the average particle diameter of the β-SiC particles can be optionally selected. However, it may be, for example, 0.01 μm or more.

The β-SiC particles synthesized by the thermal plasma CVD are spherical, have small variation in particle diameter, and have little sticking between particles. Therefore, the β-SiC particles synthesized by the thermal plasma CVD have excellent dispersibility in a solvent.

Subsequently, these starting materials are put into a solution containing a dispersant and preliminarily dispersed by using an ultrasonic dispersing device. Thereafter, the aluminum oxide particles and the β-SiC particles dispersed in the dispersion medium are pressurized and sprayed at a high speed to be mixed while colliding with each other, by using a known two-stream particle collision type pulverizing and mixing device. In this way, pulverized particles in which the aluminum oxide particles and the β-SiC particles are pulverized are obtained, and a dispersion liquid containing mixed particles obtained by mixing these pulverized particles is obtained.

When the aluminum oxide particles and the β-SiC particles are caused to collide with each other, large particles have large kinetic energy at the time of collision and are easily pulverized. On the other hand, small particles have small kinetic energy at the time of collision and are difficult to be pulverized. For this reason, the aluminum oxide particles and the β-SiC particles which are obtained by using the two-stream particle collision type pulverizing and mixing device are particles with few coarse particles or over-pulverized particles. In other words, the particles have a narrow particle size distribution width. Therefore, if the mixed particles pulverized and mixed by using the two-stream particle collision type pulverizing and mixing device are used, it is possible to suppress abnormal grain growth with coarse particles as nuclei in the step B (sintering step).

Further, for example, compared to a method of pulverizing and mixing the particles by using a pulverizing medium (media) such as a ball mill or a bead mill, in the method of pulverizing and mixing the particles by using the two-stream particle collision type pulverizing and mixing device, it is possible to suppress the mix-in of impurities caused by damage to the medium.

Therefore, by mixing the raw material particles with each other by using the two-stream particle collision type pulverizing and mixing device, it is possible to obtain a sintered body having a more uniform particle diameter.

Subsequently, the obtained dispersion liquid is dried by a known spray dryer to obtain granules composed of mixed particles of aluminum oxide particles and β-SiC particles.

Subsequently, the obtained granules are formed into a disk-shaped formed body according to the shape of a target sintered body. The forming of the granules is performed, for example, by uniaxial forming (uniaxial press forming) or the like. Hereinafter, the case of the uniaxial forming (uniaxial press forming) will be described as an example.

Subsequently, the obtained formed body is sintered at a temperature of 1600° C. or higher and 1850° C. or lower and a sintering pressure of 10 MPa or more and 50 MPa or less in an inert gas atmosphere (step B). As the inert gas atmosphere, an argon atmosphere is preferable. The temperature when performing the step B is preferably 1650° C. or higher and 1850° C. or lower, and more preferably 1700° C. or higher and 1800° C. or lower. The sintering pressure when performing the step B is preferably 20 MPa or more and 45 MPa or less, and more preferably 25 MPa or more and 40 MPa or less.

The following pretreatment (step A) may be performed prior to the step B.

First, the formed body obtained by the uniaxial forming is heat-treated in an inert gas atmosphere at normal pressure without performing pressing to remove contaminants such as moisture or a dispersion medium contained in the formed body. Here, as the inert gas, although not limited to these, for example, nitrogen or argon can be used. The normal pressure refers to not applying pressure. The temperature at the time of the heat treatment is not particularly limited as long as contaminants can be removed from the formed body without denaturing the formed body, and is, for example, 500° C.

The heat treatment temperature in the heat treatment (step A) is 500° C. or lower, and preferably 400° C. or lower. The rate of temperature rise in the step A is preferably 0.3° C./min or more and 2.0° C./min or less, and more preferably 0.5° C./min or more and 1.5° C./min or less. By setting the heat treatment temperature and the rate of temperature rise to the ranges described above, in the heat treatment (step A), a layered graphene can be formed at the grain boundaries of the aluminum oxide particles which are included in the mixed particles. Further, by setting the rate of temperature rise in the step A to 0.3° C./min or more, a sufficient dielectric constant can be obtained even in a low frequency region.

Further, the sintering (step B) may further include a preliminary heating step shown below.

The preliminary heating step is a step of heating the formed body heat-treated in the step A before sintering in the step B is performed. In the preliminary heating step, the formed body is heated (preliminarily heated) in a vacuum atmosphere. Hereinafter, there is a case where the heating in the preliminary heating step is referred to as preliminary heating. The preliminary heating temperature is not particularly limited as long as it is 1600° C. or lower. However, it may be, for example, in a range of 400° C. to 1300° C., 500° C. to 1200° C., or 600° C. to 1000° C. Further, the preliminary heating time may be, for example, in a range of 2 hours to 8 hours, or in a range of 4 hours to 6 hours. This heating may be performed at normal pressure without applying pressing. Alternatively, the preliminary heating may be pressure sintering.

According to the preliminary heating step, by appropriately setting the preliminary heating temperature, metal impurities such as alkali metal included in the mixed particles evaporate, and thus the metal impurities can be easily removed.

Therefore, according to the preliminary heating step, the purity of the mixed particles can be easily improved, and the frequency characteristic of the placing plate 11 can be easily controlled.

In the present embodiment, the term "vacuum" refers to a "state in a space filled with a gas having a pressure lower than the atmospheric pressure" and a state defined as an industrially usable pressure in the JIS standard. In the present embodiment, the vacuum atmosphere may be low vacuum (100 Pa or more). However, medium vacuum (in a range of 0.1 Pa to 100 Pa) is preferable, and high vacuum (in a range of 10-5 Pa to 0.1 Pa) is more preferable.

Further, in the present embodiment, the term "normal pressure" may be atmospheric pressure, or may be a state which is obtained by any device or the like on the condition that an atmosphere is not pressurized or depressurized.

In the present embodiment, for example, after the preliminary heating is performed at 1200° C. for 4 hours or more in a vacuum atmosphere, air pressure is returned to the atmospheric pressure with argon. Thereafter, by sintering the formed body under the conditions described above, a sintered body which is the raw material of the placing plate 11 is obtained.

Subsequently, the obtained sintered body is ground into a disk, and it is further processed to fabricate the placing plate 11.

Further, a sintered body formed in the same manner as the placing plate 11 is ground into a disk, and a through-hole is formed in the central portion of the disk when viewed in a plan view. A column made of conductive ceramics, which is complementarily fitted to the through-hole, is inserted into and fixed to the through-hole. The height of the inserted column is almost the same as the thickness of the disk, and both end portions of the column are flush with the surface of the disk. The disk processed in this manner is used as the supporting plate 12 described above.

By using the same material for the placing plate 11 and the supporting plate 12, it is possible to eliminate the difference in thermal expansion between the placing plate 11 and the supporting plate 12.

A dispersion liquid of mixed powder of powder of an insulating ceramic material and powder of a conductive material is screen-printed on the obtained supporting plate 12. This mixed powder is the raw material of the second ceramic material for forming the electrode for electrostatic attraction.

Further, a dispersion liquid of insulating ceramic powder is screen-printed on the coated surface of the supporting plate 12 at the positions to which insulation properties are to be imparted. As the "positions to which insulation properties are to be imparted", for example, the vicinities of the position where the gas supply hole for supplying a cooling gas to the mounting surface is formed, the position where the lift pin insertion hole into which a lift pin is inserted is formed, and the position which is the peripheral edge portion of the supporting plate 12 and corresponds to the insulating material layer 14, and the like can be given.

After the screen-printed dispersion liquid is dried, the placing plate 11 is mounted on the formed coating film to obtain a stacked body in which the placing plate 11, the coating film, and the supporting plate 12 are stacked in this order. The stacked body is pressure-joined under an argon atmosphere at a temperature lower than the maximum temperature at which the stacked body is sintered. The joined body processed in this manner is used as the electrostatic chuck part 2 described above.

A non-magnetic metal thin plate is bonded to the surface on the supporting plate 12 side of the obtained joined body by using a sheet-shaped or film-shaped adhesive resin having a uniform thickness and having heat resistance and insulation properties. Thereafter, the non-magnetic metal thin plate is etched to fabricate the heater element 5.

Subsequently, with respect to the joined body in which the heater element 5 is fabricated, the gas supply hole and the lift pin insertion hole penetrating the joined body are formed in preferable positions.

Subsequently, a power supply electrode is welded to the heater element 5.

Subsequently, the electrostatic chuck part 2 is fixed to the temperature adjusting base part 3 by using an adhesive having high heat resistance, whereby the electrostatic chuck device 1 can be fabricated.

According to the electrostatic chuck device having the configuration as described above, the electrostatic chuck device has a high attraction force and a good separation characteristic in the range from room temperature to a high temperature region, and can realize a good high-frequency transparency.

In the present embodiment, the heater element 5 is provided. However, an electrostatic chuck device which does not have the heater element 5 may be adopted.

The preferred embodiment example of the present invention has been described above with reference to the accompanying drawings. However, it goes without saying that the present invention is not limited to such an example. The shapes, combinations, and the like of the constituent members shown in the example described above are merely examples, and various changes can be made based on design requirements or the like within a scope which does not depart from the gist of the present invention.

EXAMPLES

Hereinafter, the present invention will be described more specifically with reference to examples and comparative examples. However, the present invention is not limited to the following examples. The following examples will be described by appropriately using the reference numerals used in the embodiment described above.

Example 1

As starting materials, β-SiC type silicon carbide (β-SiC) particles having an average particle diameter of 0.03 μm and synthesized by thermal plasma CVD, and aluminum oxide ($Al_2O_3$) particles having an average particle diameter of 0.1 μm were used.

The β-SiC particles and the $Al_2O_3$ particles were weighed such that the β-SiC particles is 8% by volume with respect to the total amount of the β-SiC particles and the $Al_2O_3$ particles. Next, these particles were put in distilled water containing a dispersant. The dispersion liquid with the β-SiC particles and the $Al_2O_3$ particles put therein was subjected to dispersion treatment by an ultrasonic dispersing device, and then pulverized and mixed by using a two-stream particle collision type pulverizing and mixing device.

The obtained mixed solution was spray-dried with a spray dryer to obtain mixed particles of β-SiC and $Al_2O_3$.

The mixed particles were subjected to uniaxial press forming at a press pressure of 8 MPa to obtain a formed body having a diameter of 320 mm and a thickness of 15 mm.

Subsequently, the formed body was heat-treated by heating it to 385° C. with a rate of temperature rise of 0.5° C./min in a nitrogen atmosphere without applying a press pressure to remove moisture and a dispersant (contaminants).

The obtained formed body was set in a graphite mold and pressure-sintering was performed. The sintering condition was set to be a press pressure of 5 MPa in a vacuum atmosphere up to 1100° C. Thereafter, sintering was performed at a temperature of 1800° C. and a press pressure of 40 MPa in an argon atmosphere.

The obtained sintered body was processed to fabricate a formed body having a diameter of 310 mm and a thickness of 3 mm. The obtained formed body corresponds to the "placing plate" in the embodiment described above.

Further, the sintered body obtained in the same manner was processed into a formed body having a diameter of 310 mm and a thickness of 3 mm, and a through-hole having a diameter of 3 mm was formed at the central portion of the formed body. A column formed by processing a sintered body of aluminum oxide-tantalum carbide (tantalum carbide: 30% by volume) in accordance with the shape of the through-hole was inserted into and fixed to the formed through-hole. The obtained formed body corresponds to the "supporting plate" in the embodiment described above.

A conductive dispersion liquid was prepared by mixing aluminum oxide particles, acicular carbon (0.1 μm in a lateral direction, and 2 μm in a longitudinal direction), and screen oil (terepinol). At that time, the acicular carbon was mixed so as to be 5% by volume with respect to the total amount of the aluminum oxide particles and the acicular carbon.

Further, an insulating dispersant was prepared by mixing aluminum oxide and screen oil.

The conductive dispersion liquid was printed on the surface of the supporting plate into the shape of the electrode for electrostatic attraction by using a screen printing apparatus. Further, the insulating dispersant was printed on the surface of the supporting plate in the vicinities of the position where the gas supply hole for supplying a cooling gas to the mounting surface is formed, the position where the lift pin insertion hole into which a lift pin is inserted is formed, and the position which is the peripheral edge portion of the supporting plate 12 and corresponds to the insulating material layer 14.

The placing plate was superposed on the printed side of the supporting plate and pressure-joined by using a hot press machine.

The obtained joined body was processed such that the thickness of the placing plate was 0.5 mm, the thickness of the supporting plate was 1.0 mm, and the outer diameter was 293 mm. Further, the gas supply hole and the lift pin insertion hole were formed in the joined body.

Blasting was performed on the surface on the placing plate side of the joined body, in which the through-holes were formed, to form the peripheral edge wall 17. Further, the columnar projection portions 30 each having a diameter of 0.5 mm and a height of 40 μm were formed on the surface of the placing plate by the blasting to obtain the electrostatic chuck part 2.

The electrostatic chuck part 2 and the temperature adjusting base part 3 made of aluminum were bonded together by using a silicone-based adhesive. As the temperature adjusting base part 3, a temperature adjusting base part having thermally sprayed films of aluminum oxide formed on the upper surface and the side surface was used. By the above, the electrostatic chuck device of Example 1 was obtained.

Example 2

An electrostatic chuck device of Example 2 was obtained in the same manner as in Example 1 except that the formed body was heat-treated by heating it to 385° C. with a rate of temperature rise of 1.0° C./min in a nitrogen atmosphere.

Comparative Example 1

An electrostatic chuck device of Comparative Example 1 was obtained in the same manner as in Example 1 except that the formed body was heat-treated by heating it to 385° C. with a rate of temperature rise of 0.2° C./min in a nitrogen atmosphere.

Comparative Example 2

An electrostatic chuck device of Comparative Example 2 was obtained in the same manner as in Example 1 except that the formed body was heat-treated by heating it to 385° C. with a rate of temperature rise of 0.1° C./min in a nitrogen atmosphere.

[Scanning Transmission Electron Microscope Image of Placing Plate]

The placing plates of the electrostatic chuck devices of Examples 1 and 2 and Comparative Examples 1 and 2 were observed with a scanning transmission electron microscope (STEM).

Figure 2:
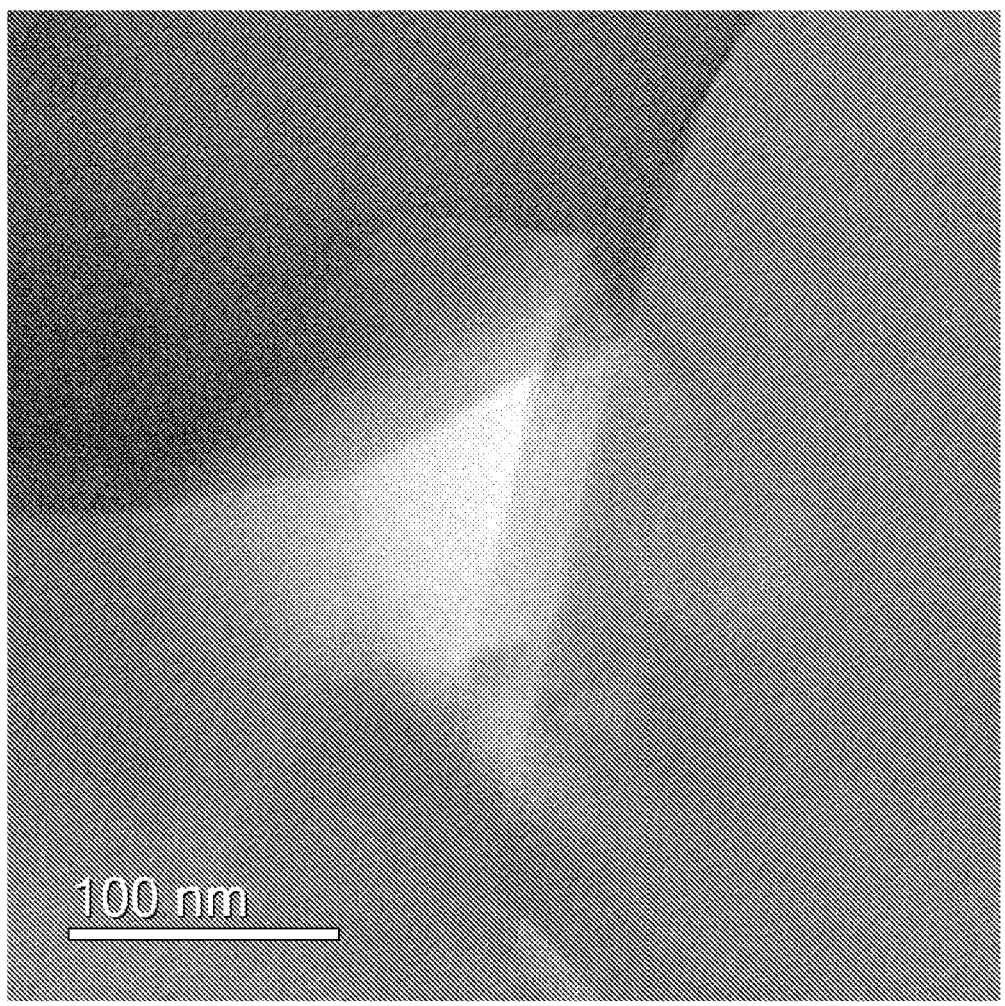
FIG. 2 is a scanning transmission electron microscope image showing a placing plate in Example 1.
Figure 3:
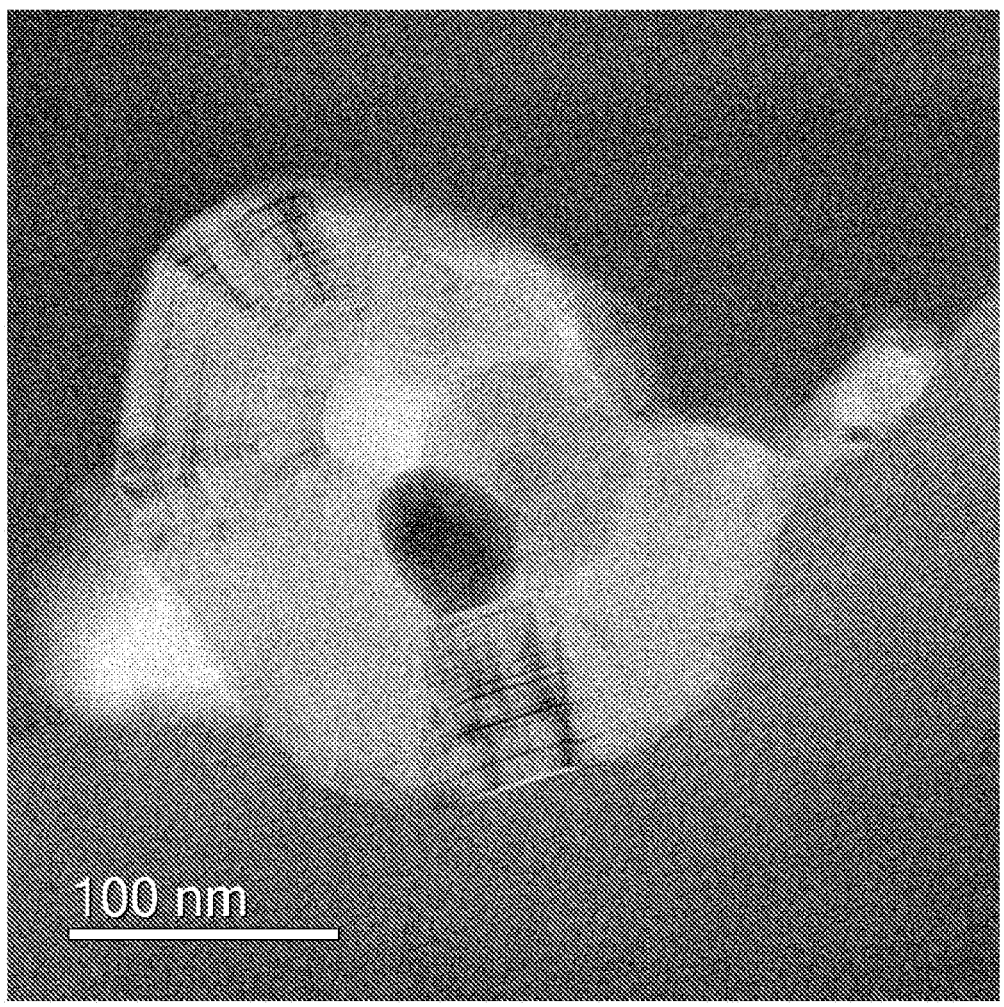
FIG. 3 is a scanning transmission electron microscope image showing a placing plate in Example 2.
Figure 4:
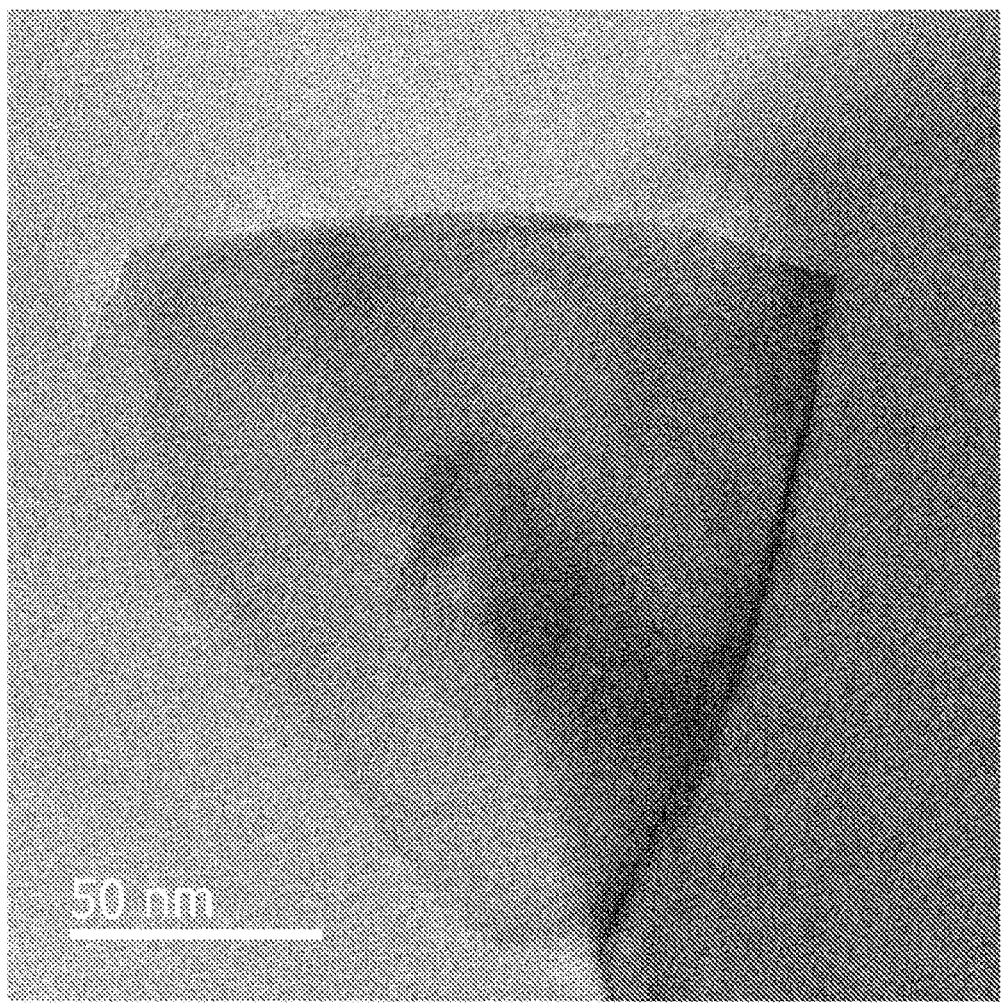
FIG. 4 is a scanning transmission electron microscope image showing a placing plate in Comparative Example 1.
Figure 5:
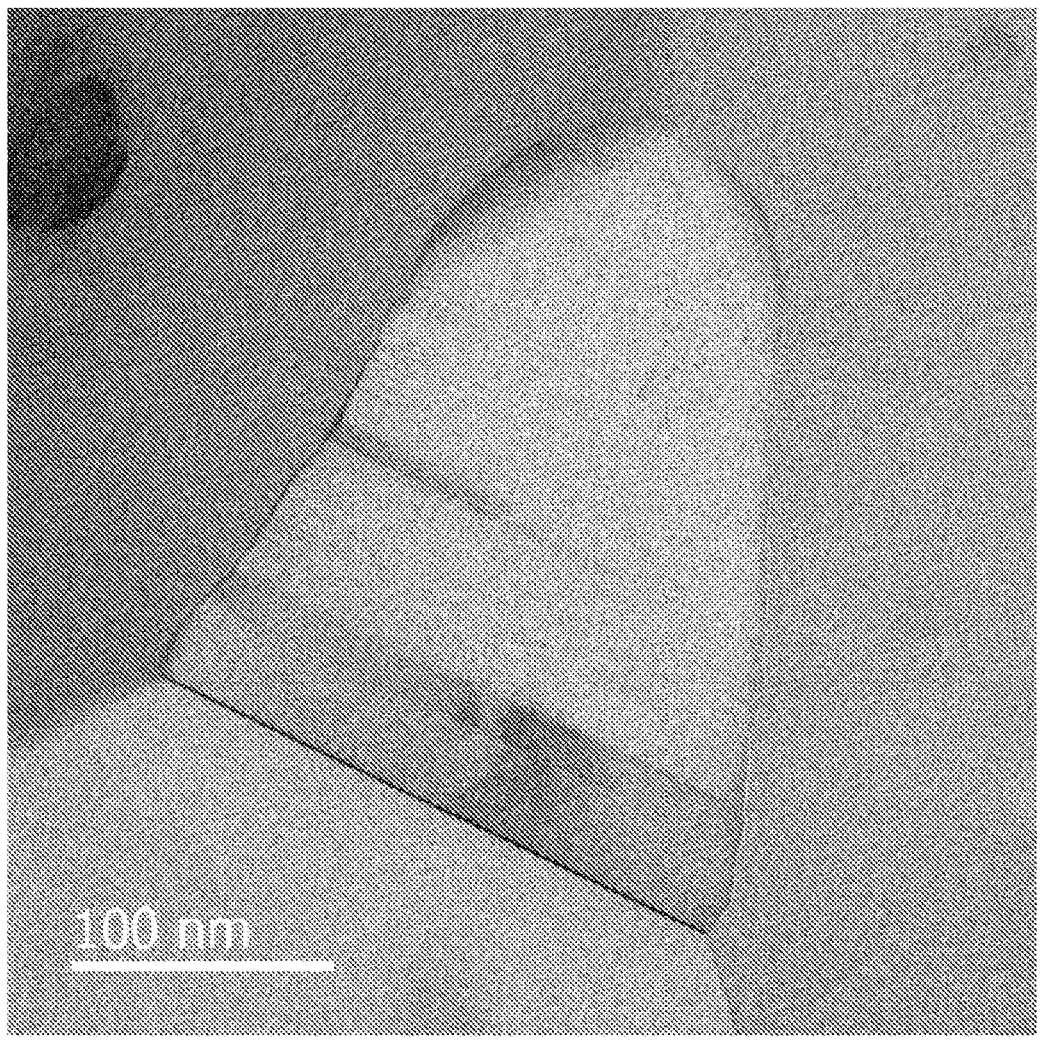
FIG. 5 is a scanning transmission electron microscope image showing a placing plate in Comparative Example 2.

FIG. 2 shows a scanning transmission electron microscope image of the placing plate in Example 1. FIG. 3 shows a scanning transmission electron microscope image of the placing plate in Example 2. FIG. 4 shows a scanning transmission electron microscope image of the placing plate in Comparative Example 1. FIG. 5 shows a scanning transmission electron microscope image of the placing plate in Comparative Example 2.

From the results of FIGS. 2 and 3, it was confirmed that in the placing plates in Examples 1 and 2, a layered graphene was present at the grain boundary of aluminum oxide in the sintered bodies configuring the placing plates.

On the other hand, from the results of FIGS. 4 and 5, it was confirmed that in the placing plates in Comparative Examples 1 and 2, a layered graphene was not present at the grain boundary of aluminum oxide in the sintered bodies configuring the placing plates.

The reason why the layered graphene was not formed in the comparative examples is assumed that if the rate of temperature rise is lowered, the reaction between the graphene and the oxygen atom adjacent to the graphene easily proceeds, and they are discharged out of a system as the degassing of $CO$, $CO_2$, or the like.

[Relative Dielectric Constant of Placing Plate]

Figure 6:
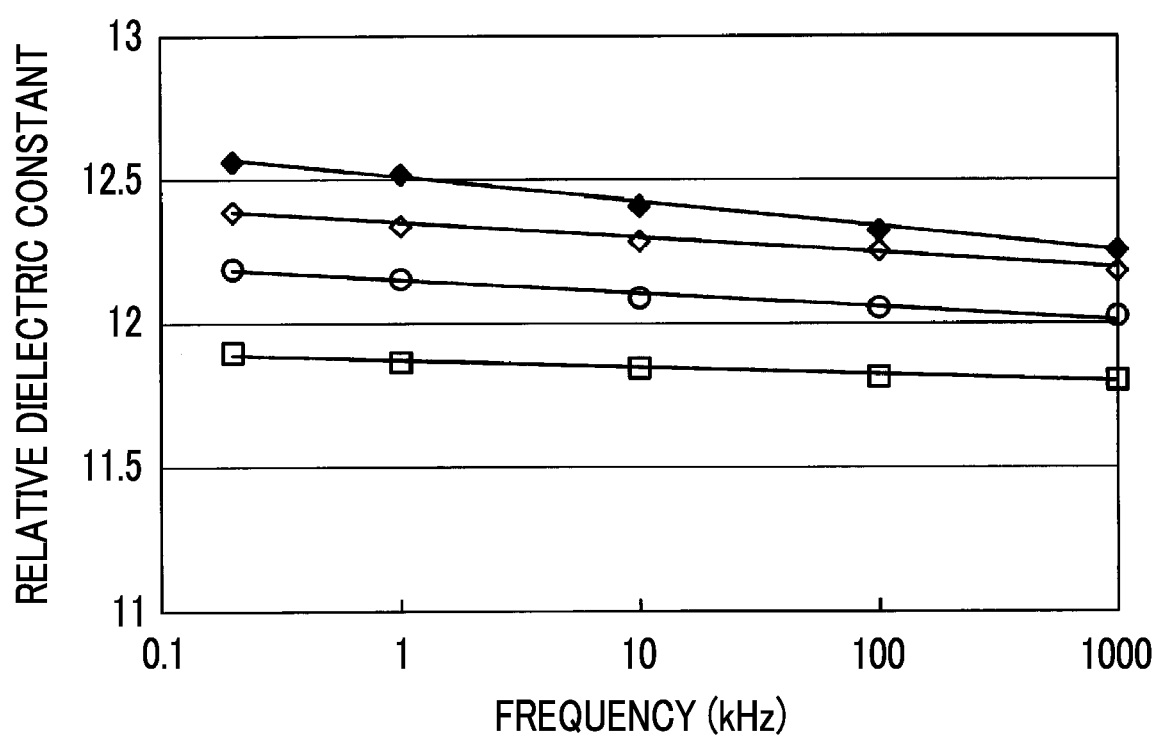
FIG. 6 is a diagram showing measurement results of relative dielectric constant of the placing plates of electrostatic chuck devices of Examples 1 and 2 and Comparative Examples 1 and 2.

Electrodes made of aluminum were placed on the mounting surfaces of the electrostatic chuck devices of Examples 1 and 2 and Comparative Examples 1 and 2, electrostatic capacity between each of the power feed portions to the electrode for electrostatic attractions and each of the electrodes made of aluminum was measured by using an LCR meter, and the relative dielectric constants were calculated by using the measured values. The results are shown in Table 1 and FIG. 6. In FIG. 6, a white diamond represents Example 1, a black diamond represents Example 2, a white square represents Comparative Example 1, and a white circle represents Comparative Example 2.

From the results of Table 1 and FIG. 6, it was confirmed that the placing plates of Examples 1 and 2 had a higher relative dielectric constant than the placing plates of Comparative Examples 1 and 2.

TABLE 1

|  | Rate of temperature rise | Measurement frequency [kHz] | | | | |
| --- | --- | --- | --- | --- | --- | --- |
|  | [° C./min] | 0.2 | 1 | 10 | 100 | 1000 |
| Example 1 | 0.5 | 12.4 | 12.4 | 12.3 | 12.3 | 12.2 |
| Example 2 | 1 | 12.57 | 12.53 | 12.42 | 12.33 | 12.27 |
| Comparative Example 1 | 0.2 | 12.2 | 12.2 | 12.1 | 12.1 | 12.0 |
| Comparative Example 2 | 0.1 | 11.9 | 11.9 | 11.8 | 11.8 | 11.8 |

INDUSTRIAL APPLICABILITY

According to the present invention, it is possible to provide an electrostatic chuck device that has a high attractive force and can suitably transmit a high frequency, and a method for manufacturing the electrostatic chuck device.

REFERENCE SIGNS LIST

1: electrostatic chuck device
2: electrostatic chuck part
3: temperature adjusting base part
8: resin layer
11: placing plate (base)
12: supporting plate
13: electrode for electrostatic attraction
14: insulating material layer
19: mounting surface
30: projection portion
W: plate-shaped sample

The invention claimed is:

1. An electrostatic chuck device comprising:
a base having one main surface serving as a mounting surface on which a plate-shaped sample is mounted; and
an electrode for electrostatic attraction provided on a side opposite to the mounting surface in the base,
wherein the base consists of a ceramic material, and
the ceramic material is a sintered body containing aluminum oxide and silicon carbide as main components thereof and having a layered graphene present at a grain boundary of the aluminum oxide.

2. The electrostatic chuck device according to claim 1, wherein the sintered body further contains β-SiC type silicon carbide.

3. The electrostatic chuck device according to claim 1, wherein a relative dielectric constant of the ceramic material at a frequency of 10 Hz is 12.3 or more, and a relative dielectric constant of the ceramic material at a frequency of 1 MHz is 12.5 or less.

4. A method for manufacturing the electrostatic chuck device according to claim 1, the method comprising:
a step of heating a formed body obtained by forming granules composed of mixed particles of aluminum oxide particles and silicon carbide particles, at a temperature of 500° C. or lower with a rate of temperature rise of 0.3° C./min or more; and
a step of sintering the formed body, which has been treated in the step of heating, to form a sintered body containing aluminum oxide and silicon carbide as main components thereof and having a layered graphene present at a grain boundary of the aluminum oxide.

5. The electrostatic chuck device according to claim 2, wherein the sintered body contains 4% by volume or more and 15% by volume or less of the β-SiC type silicon carbide based on that of the sintered body.

6. The electrostatic chuck device according to claim 1, wherein the electrode for electrostatic attraction uses conductive ceramics as a forming material.

7. The electrostatic chuck device according to claim 1, wherein the base is made of only the ceramic material, and
the silicon carbide is composed of only β-SiC type silicon carbide.

8. The electrostatic chuck device according to claim 1, wherein in the ceramic material, an average crystal grain size of crystal grains of the aluminum oxide is 2 μm or less, and an average crystal grain size of crystal grains of the silicon carbide is 0.2 μm or less, and
a thickness of the layered graphene is 5 nm or more and 1000 nm or less.

9. The method for manufacturing the electrostatic chuck device according to claim 4,
wherein the step of sintering the formed body contains a sub-step of heating the formed body at a temperature of 1600° C. or lower in a vacuum atmosphere, before sintering in an inert gas atmosphere.

10. The method for manufacturing the electrostatic chuck device according to claim 4,
wherein the step of heat-treating is performed at normal pressure in an inert gas atmosphere.

* * * * *